United States Patent
Graesslin et al.

(10) Patent No.: US 7,615,999 B2
(45) Date of Patent: Nov. 10, 2009

(54) METHOD AND CIRCUIT ARRANGEMENT FOR OPERATING MULTI-CHANNEL TRANSMIT/RECEIVE ANTENNA DEVICES

(75) Inventors: Ingmar Graesslin, Boenningstedt (DE); Peter Vernickel, Hamburg (DE); Christoph Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 192 days.

(21) Appl. No.: 11/912,685

(22) PCT Filed: Apr. 24, 2006

(86) PCT No.: PCT/IB2006/051265

§ 371 (c)(1),
(2), (4) Date: Oct. 26, 2007

(87) PCT Pub. No.: WO2006/117714

PCT Pub. Date: Nov. 9, 2006

(65) Prior Publication Data

US 2009/0128153 A1      May 21, 2009

(30) Foreign Application Priority Data

Apr. 29, 2005    (EP) ................... 05103584

(51) Int. Cl.
    *G01V 3/00*    (2006.01)
(52) U.S. Cl. ...................... 324/322; 324/318

(58) Field of Classification Search ......... 324/300–322, 324/553, 512, 529, 530, 645; 600/407–445; 340/514, 561
See application file for complete search history.

(56) References Cited

U.S. PATENT DOCUMENTS

| 5,777,475 A | 7/1998 | Vester |
| 6,104,287 A | 8/2000 | Meyer |
| 6,452,392 B1 * | 9/2002 | Wetzel ........................ 324/318 |

(Continued)

FOREIGN PATENT DOCUMENTS

DE    4331021 A1    3/1995

(Continued)

OTHER PUBLICATIONS

Graesslin, I., et al.; Whole Body 3T MRI System with Eight Parallel RF Transmission Channels; 2006; Proc. Intl. Soc. Mag. Reson. Med.; 14:129.

(Continued)

*Primary Examiner*—Brij B Shrivastav

(57) ABSTRACT

Methods and circuit arrangements for operating a multi-channel transmit/receive antenna device or arrangement, especially for use in a magnetic resonance imaging (MRI) system, are disclosed by which RF amplifiers can be used to their full peak power capability without running the risk that the RF amplifier is damaged due to excessive reflected power at its output. Furthermore by evaluating certain forward and reflected power signals patient safety is achieved with respect to monitoring the limits of the specific absorption rate.

12 Claims, 3 Drawing Sheets

U.S. PATENT DOCUMENTS

Figure 1:
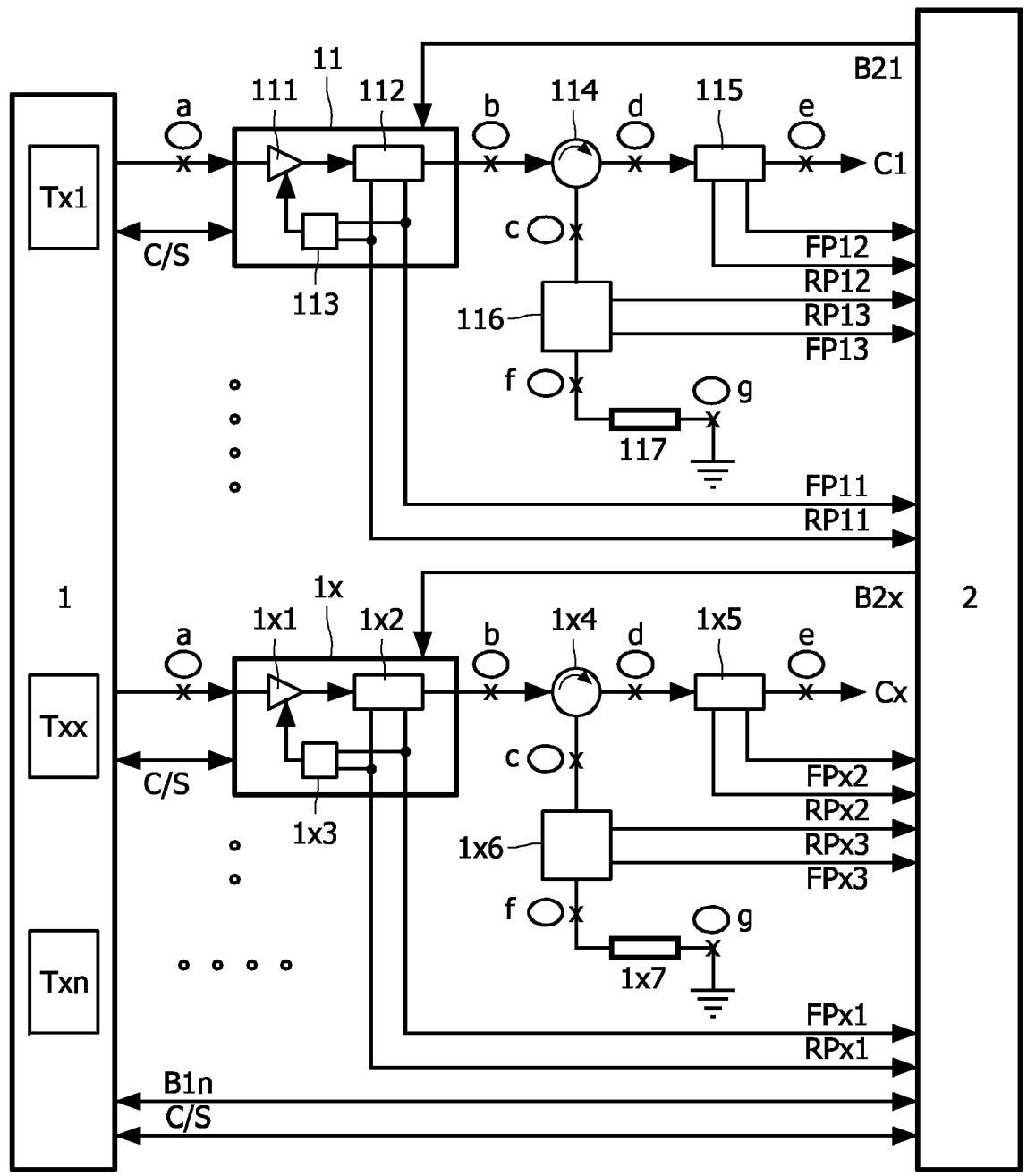

| | | | |
|---|---|---|---|
| 6,542,392 | B2 | 4/2003 | Yanagawa |
| 7,439,742 | B2 * | 10/2008 | Fontius et al. ............... 324/318 |
| 2002/0086643 | A1 | 7/2002 | Leipala |
| 2003/0122546 | A1 | 7/2003 | Leussler |
| 2006/0025088 | A1 | 2/2006 | Pietig et al. |
| 2007/0260138 | A1 * | 11/2007 | Feldman et al. ............. 600/409 |
| 2008/0088305 | A1 * | 4/2008 | Olson et al. ................. 324/309 |
| 2008/0129298 | A1 * | 6/2008 | Vaughan et al. ............ 324/322 |

FOREIGN PATENT DOCUMENTS

| | | |
|---|---|---|
| JP | 01011537 A | 1/1989 |
| WO | 2005034141 A2 | 4/2005 |

OTHER PUBLICATIONS

Scarpa, F., et al.; A 2.5 kW, Low Cost 352 MHz Solid State Amplifier for CW and Pulsed Operation; 2002; Proc. of EPAC, Paris, France; pp. 2314-2316.

* cited by examiner

METHOD AND CIRCUIT ARRANGEMENT FOR OPERATING MULTI-CHANNEL TRANSMIT/RECEIVE ANTENNA DEVICES

The invention relates to a method and circuit arrangement for operating a multi-channel transmit/receive antenna device or arrangement, comprising safety means, especially for use in a magnetic resonance imaging (MRI) system, as well as such a system.

Multi-channel transmit/receive antenna devices or arrangements comprising a plurality of antenna elements, especially in the form of RF coils and/or parts, elements or segments of such coils (which are commonly referred to in the following as "coil segments") which can individually be controlled and which are positioned in a distributed array offer numerous advantages in comparison to a one-channel RF coil especially when used in a magnetic resonance imaging system. Such multi-channel transmit/receive antenna devices or arrangements are for example disclosed in EP 1 314 995.

Such an antenna device makes it possible to generate RF fields ($B_1$ fields) with a certain homogeneous or other distribution of the field strength in order for example to excite nuclei only in a region of interest of a patient or to tailor the field in order to realize arbitrary excitation patterns. Furthermore, special sequences of RF signals, higher field strengths, high flip angles or real-time sequences can be realized and generated by such multi-channel antenna arrangements, and multi-dimensional excitations can be accelerated.

A circuit arrangement for operating such an antenna device comprises a multi-channel RF amplifier or a number of one-channel RF amplifiers, wherein the number of channels and amplifiers, respectively, is usually equal to the number n of coils and/or coil segments of the antenna device.

In contrary to the case in which a one-channel RF amplifier and one RF coil is used, it has to be considered that the RF coils and/or coil segments couple more or less with each other. Due to this and a higher mismatching which can be caused by couplings, the RF power which is reflected back to the output of the RF amplifiers may reach considerably higher values so that the risk of damaging the RF amplifier cannot be neglected. Furthermore, it has to be considered that in case of a hardware failure, especially a broken connection to at least one of the coils and/or coil segments, reflections may increase substantially and the generated field becomes undeterminable so that unsave situations or safety hazards are created for a patient as well as for the RF amplifiers or other hardware components.

Because an RF amplifier is usually capable of accepting only a fraction of its peak power level as reflected power at its output, the full peak power capability of such an RF amplifier cannot be used in order to avoid the risk of damage due to reflected power at its output. Even in case of using an internal power monitoring unit which switches off the RF amplifier if a certain power level is exceeded at its output, this cannot prevent that reflected RF power which is generated by other RF amplifiers in the circuit arrangement reaches the output due to couplings of the channels and damages the RF amplifier which is switched off.

One object underlying the invention is to provide a method and a circuit arrangement for operating a multi-channel transmit/receive antenna device or arrangement by which the safety for hardware components like especially the RF amplifiers can be improved substantially.

Furthermore, a method and a circuit arrangement for operating a multi-channel transmit/receive antenna device or arrangement shall be provided, by which additionally to the safety for hardware components, it can be ensured that a set maximum RF power which is applied to an examination object and especially a specific absorption rate of a patient is not exceeded.

The object is solved by a circuit arrangement according to claim 1 and a method according to claim 6, respectively.

These solutions have the advantage, that the full peak power capability of an RF amplifier can be used without running the risk that the RF amplifier is switched off or damaged due to a comparatively small reflected RF power at its output. By this, RF amplifiers can be used which have a peak power in a range which is actually needed for the circuit arrangement. Due to the fact that power electronics determine to a large extent the cost of a circuit arrangement, this has substantial economic advantages.

The subclaims disclose advantageous embodiments of the invention.

The circuit arrangements according to claims 2 to 5 have the advantage that a specific absorption rate of an examination object, especially a patient, can be monitoring and it can be ensured that a set maximum RF power level which is radiated is not exceeded even in case of a hardware failure like especially a broken line to at least one of the coils and/or coil segments of the antenna arrangement.

Figure 2:
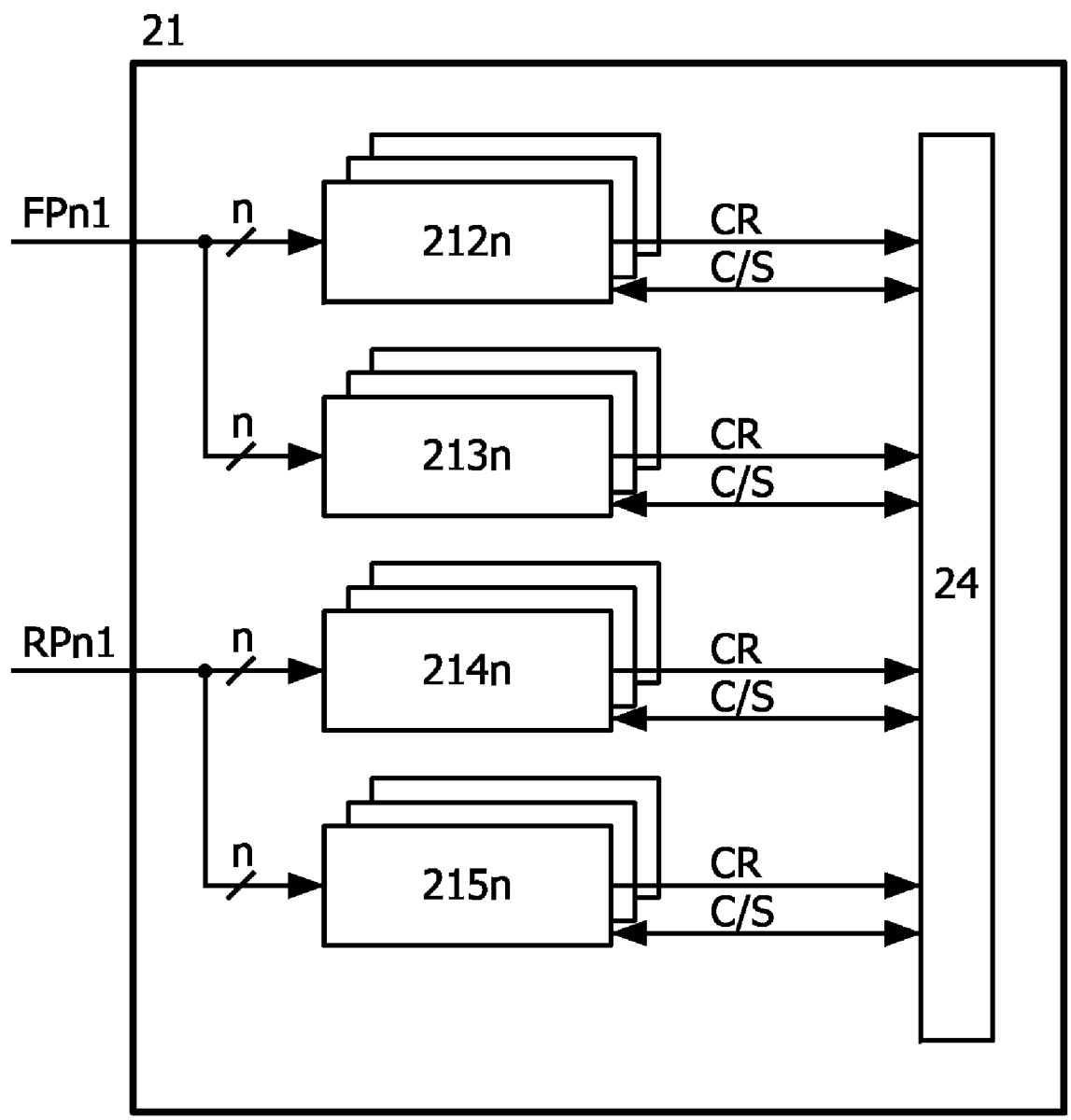
Figure 3:
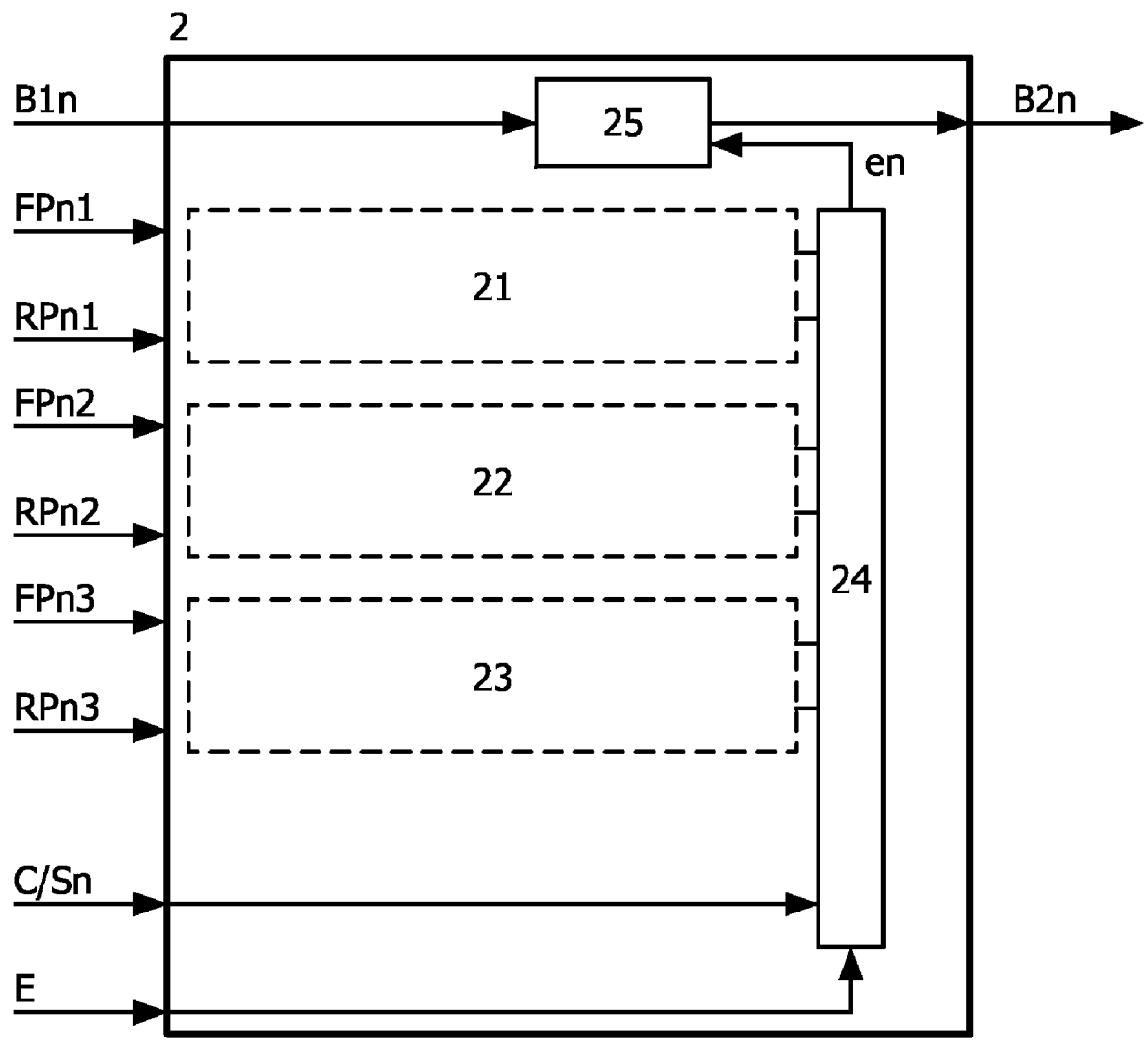

Further details, features and advantages of the invention become obvious from the following description of exemplary and preferred embodiments of the invention with reference to the drawings in which shows:

FIG. 1 a schematic block diagram of a circuit arrangement according to a preferred embodiment of the invention, FIG. 2 a schematic block diagram of a submodule of a central power monitoring unit of the circuit arrangement according to FIG. 1, and FIG. 3 a schematic block diagram of the central power monitoring unit according to FIG. 1.

Several multi-channel transmit/receive antenna devices or arrangements which can be operated by a method and circuit arrangement according to the invention are disclosed exemplarily in the above mentioned EP 1 314 995 which is made by reference to a part of this disclosure.

Such an antenna device is especially a RF coil arrangement comprising a number n of RF coils and/or coil segments (or coil elements or parts) with different sizes and/or different positions which are each connected to a transmit/receive unit or channel 1, . . . n of a circuit arrangement according to the invention in order to be controlled individually.

FIG. 1 shows a schematic block diagram of a preferred embodiment of a circuit arrangement for operating a multi-channel transmit/receive antenna device, wherein the circuit arrangement is a part of a magnetic resonance imaging (MRI) system and especially of a related multi-channel data acquisition system. The circuit arrangement is exemplarily provided for operating a transmit/receive antenna device or arrangement comprising n coils (and/or coil segments) for generating a $B_1$ field and for receiving relaxation signals from an object to be examined.

Substantial components of the circuit arrangement are preferably implemented in a spectrometer 1 in the form of one or more add-on circuit boards. These circuit boards are preferably a number n of transmit board Tx1, . . . Txx, . . . Txn and a corresponding number n receive boards (not shown) which each comprise a transmit channel and a receive channel, respectively. By using a circulator 114 (1x4) with a high power RF load 117 (1x7) connected between the output of the RF amplifier unit 11 (1x) and the coil or coil segment C1 (Cx) which is driven, most of the RF power which is reflected from the coil or coil segment C1 (Cx) or which is coupled from one to an other the coil or coil segment Cx is dissipated in the RF load 117 (1x7) of the circulator 114 (1x4) so that the RF amplifier 111 (1x1) receives only a very small fraction of the reflected power level at its output.

The transmit boards Tx1, . . . Txn are controlled by the spectrometer 1, especially a central control or processor unit within the spectrometer 1, in order to generate RF signals with different and varying amplitudes and/or phases and/or waveforms and/or frequencies. These RF signals are then amplified by each one-channel RF amplifier 11, . . . 1x, . . . 1n as shown for channel 1 and channel x in FIG. 1 or by a multi-channel RF amplifier having n channels, and then supplied to each one coil or coil segment C1, . . . Cx, . . . Cn of the antenna arrangement.

Furthermore, the circuit arrangement comprises a central power monitoring unit 2 for monitoring forward and reflected RF power level signals which are decoupled from the RF path of each channel at different locations, and for possible blanking one or all of the RF amplifiers 11, . . . 1n if certain set maximum power levels supplied to the number of n coils and/or coil segments and/or sums of such power levels from different channels are exceeded.

The circuit arrangement shall now be described in more details with reference to FIG. 1 and with respect to the two channels 1 and x which are exemplarily shown in FIG. 1. All channels 1, . . . x, . . . n are constructed preferably identical.

The output RF transmit signal (demand signal) which is generated by the transmit board Tx1 (Txx) is supplied to the RF amplifier unit 11 (1x) which comprises an RF amplifier 111 (1x1), a first directional coupler 112 (1x2) and an internal power monitoring unit 113 (1x3). The output signal of the first directional coupler 112 (1x2) is fed into a first terminal and out of a second terminal of a circulator 114 (1x4) and through a second directional coupler 115 (1x5) to an associated coil or coil segment C1 (Cx) of the antenna arrangement. The third terminal of the circulator 114 (1x4) is connected via a third directional coupler 116 (1x6) to a high power RF load 117 (1x7).

By using a circulator 114 (1x4) with a high power RF load 117 (1x7) connected between the output of the RF amplifier unit 11 (1x) and the coil or coil segment C1 (Cx) which is driven, most of the RF power which is reflected from the coil or coil segment C1 (Cx) is dissipated in the RF load 117 (1x7) of the circulator 114 (1x4) so that the RF amplifier 111 (1x1) receives only a very small fraction of the reflected power level at its output.

As mentioned above, this has the advantage that the ful peak power capability of an RF amplifier can be used. Furthermore, in case of a multi-channel transmit/receive system, this risk of damage due to RF power generated by other active RF amplifiers which is transmitted via couplings between the channels. can be avoided.

By using a circulator 114 (1x4) and a high power RF load 117 (1x7) according to the invention, the shutdown of the RF amplifier 111 (1x1) by the internal power monitoring unit 113 (1x3) in case of reflected power levels that lie above the level the RF amplifier can withstand at its output is prevented.

The circulator 114 (1x4) has for example a forward damping of about 0.2 dB and a damping of about 20 dB for the reflected power. The circulators and the loads of all channels are preferably mounted on a forced air cooled or water cooled heat sink which can be mounted inside a rack. This enables to build the whole circuit arrangement very compact which is particularly interesting if using a small multi-channel RF amplifier. The RF load 117 (1x7) is preferably dimensioned to be able to withstand at least the peak power of the RF amplifier 111 (1x1).

The first directional coupler 112 (1x2) at the output of the RF amplifier 111 (1x1) comprises outputs for a forward power signal FP11 (FPx1) and a reflected power signal RP11 (Px1), which are connected with the inputs of the internal power monitoring unit 113 (1x3). The output signal of this power monitoring unit 113 (1x3) controls the RF amplifier 111 (1x1). By this, it can additionally be prevented that the RF amplifier 111 (1x1) is damaged for example by excessive reflected RF power (e.g. due to a broken line at point b). Furthermore, it can be prevented by evaluating the forward power signal FP11 (FPx1) by means of the power monitoring unit 113 (1x3) that certain preset maximum values of peak RF power levels generated by the RF amplifier 111 (1x1) are exceeded.

Due to the circulator 114 (1x4), it is preferred not to use conventional specific absorption rate (SAR) monitoring concepts as they might be not safe and reliable enough in connection with such circulators. In order to sufficiently guarantee safety of a patient and to fulfill the prescribed specific absorption rate limits, as well in a case in which a line or cable in the path between a transmit board Txx and a coil or coil segment Cx is broken or disconnected (which will lead to an undetermined field distribution and thus a potential safety hazard for a patient), one or more of the directional couplers explained in the following are used in order to evaluate some or all of their output signals by the central power monitoring unit 2. By this, a specific absorption rate of a patient can be monitored and furthermore one or all of the RF amplifiers can simultaneously be switched off in case of a hardware failure, especially a broken or disconnected line at at least one of the locations "a" to "g" indicated in FIG. 1.

The outputs of the first directional coupler 112 (1x2) for a forward and a reflected power signal FP11, RP11 (FPx1, RPx1) are as well connected with the central power monitoring unit 2 for evaluation. This applies as well for the second directional coupler 115 (1x5) at the second terminal of the circulator 114 (1x4) which comprises outputs for a forward power signal FP12 (FPx2) and a reflected power signal RP12 (RPx2), which are connected with the central power monitoring unit 2. Finally, the third directional coupler 116 at the RF load 117 (1x7) comprises outputs for a forward power signal FP13 (FPx3) and a reflected power signal RP13 (RPx3) which are as well connected with the central power monitoring unit 2.

The central power monitoring unit 2 individually controls each RF amplifier unit 11, . . . 1x, . . . 1n in dependence on these forward and reflected power signals by means of the output blanking signals B21 (B2x) which are supplied to the RF amplifier units 11 (1x).

Furthermore, a number of n input blanking signals B in are supplied via a connection from the spectrometer 1 to the central power monitoring unit 2 for signaling the possible case in which one or more transmit boards Tx1, . . . Txn are not active or have an intended value of 0, in order to enable the central power monitoring unit 2 to distinguish between an intended powerless condition of a channel and a fault condition (e.g. a broken or disconnected line) of a channel. This information can be sent at a rather low time resolution or as a bin-information via a control status bus C/S between the spectrometer 1 and the central power monitoring unit 2 as well. Finally, the RF amplifier units 111 (1x1) are connected with the spectrometer 1 via the control status bus C/S as well.

For monitoring the specific absorption rate of a patient and for ensuring safety for the patient, preferably the reflected power signal RP1 (RPx1) of the first directional coupler 112 (1x2), the forward power signal FP12 (FPx2) of the second directional coupler 115 (1x5) and the forward power signal FP13 (FPx3) of the third directional coupler 116 (1x6) are evaluated by the central power monitoring unit 2. In this case the other forward and reflected power signals need not to be monitored, but they can be used as a redundant information. The evaluation itself will be explained with reference to FIGS. 2 and 3.

FIG. 2 shows a simplified block diagram of substantial components of a submodule 21 of the central power monitoring unit 2.

This submodule 21 comprises a number of n first inputs FPn1 for the number of n transmit or forward RF power signals from the first directional couplers 112, ... 1x2, ... 1n2 of all channels and a number of n second inputs RPn1 for the number of n reflected RF power signals from the first directional couplers 112, ... 1x2, ... 1n2 of all channels of the circuit arrangement.

A number n of first detection units 212n for a maximum trip level and a number n of second detection units 213n for a maximum sum level are provided, the inputs of which are connected with the first inputs FPn1 of the submodule 21.

Furthermore, a number n of third detection units 214n for a maximum trip level and a number n of fourth detection units 215n for a maximum sum level are provided, the inputs of which are connected with the second inputs RPn1 of the submodule 21.

Finally, FIG. 2 shows a part of a central control unit 24 having each a number of n inputs for comparison results CR of each of the first, second, third and fourth detection units 212n, 213n, 214n, 215n, respectively, and is connected with each of these units via a control status bus C/S.

The detection units 212n; 214n for a maximum trip level are provided for comparing for each channel 1, ... x, ... n an actual forward and reflected power level signal, respectively, with related maximum trip levels which are set for each channel independently and preferably with different values, and transmit the comparison results CR to the central control unit 24.

The detection units 213n, 215n for a maximum sum power are provided for comparing an actual forward and reflected sum power level signal of two or more channels, respectively, with a maximum sum power level which is set independently for the forward and reflected power, respectively, and transmit the comparison results CR to the central control unit 24.

If one of the comparison results of the detection units 212n; 214n; 213n, 215n indicates that an actual power level exceeds a maximum trip level or an actual sum level exceeds a maximum sum level, the central control unit 24 enables the blanking switches 25 (FIG. 3) in order to turn off the RF amplifier units 11, ... 1n simultaneously and immediately via the blanking signals at the outputs B2n.

The detection units 212n, 213n, 214n, 215n are preferably provided for converting the input RF signals to DC signals for further processing. For this purpose, preferably logarithmic amplifiers, digital potentiometers and comparison circuitry based on operational amplifiers are provided. Preferably, the signals are converted to digital signals for processing in the digital domain.

FIG. 3 shows a schematic block diagram of the complete central power monitoring unit 2 according to FIG. 1.

The power monitoring unit 2 comprises three submodules 21, 22, 23, the central control unit 24, to which the comparison results of all submodules 21, 22, 23 are submitted, and an n channel blanking switch 25 (or a number n of one-channel blanking switches) the inputs B1n of which are connected with the spectrometer 1 and the outputs B2n of which are connected with the RF amplifier units 11, ... 1n as indicated in FIG. 1.

The blanking switch 25 is controlled by an enabled signal "en" which is generated by the central control unit 24 for switching off at least one of the RF amplifier units 11, ... 1n via the blanking outputs B2n, in dependence on the evaluation of the comparison results CR of the submodules 21, 22, 23 as explained above.

Preferably, the central power monitoring unit 24 is running in real-time and is continuously or only during a scan of a patient within the system monitoring the said signals.

Finally FIG. 3 shows the input C/Sn for the control status bus C/S to and from the spectrometer 1 and an input E for signals representing certain environmental conditions.

By the circuit arrangement according to the invention, on the one hand the RF amplifiers can be used to their full peak power level and on the other hand the RF power which is applied to a patient can effectively be limited and it is ensured that the specific absorption rate is not exceeded especially in the case, in which an antenna device with a plurality of independently operated coils and/or coil segments is used and a hardware failure occurs in one or more of these coils or coil segments or the related channels.

Furthermore, the method and circuit arrangement according to the invention is applicable as an essential component of high and ultra-high field systems to realize whole body imaging.

Summarizing the above, the method and circuit arrangement according to the invention makes it possible to:
- use almost any single or multi-channel RF amplifier (tube or solid state) for use in a multi-channel transmit system regardless of its level of reflected power it can withstand,
- guarantee that the SAR safety limits are met for any MR sequence but in particular for those sequences which approach the acceptable SAR limits for patients, and in case of a hardware failure of any RF transmit channel driving its RF coil element,
- provide a basis for the extension of the IEC norm to cover safety measurements for multi-channel RF transmit MRI systems, which are expected to gain in particular importance for high and ultra-high field MRI systems and
- correlate the demand RF transmit signal with the forward power signal enabling the distinction between a zero amplitude demand signal (non critical state) and a broken or disconnected cable (critical state).

The invention claimed is:

1. Circuit arrangement for operating a multi-channel transmit/receive antenna device or RF coil arrangement, with a number n of RF coils and/or coil segments, for use in a magnetic resonance imaging system, comprising directional couplers, characterized in:
  a number n of RF amplifiers or a multi-channel RF amplifier having n channels, for amplifying transmit signals to be fed to the number n of channels of the multi-channel transmit/receive antenna device or of RF coils and/or coil segments of the RF coil arrangement, respectively;
  a number n of circulators which are each connected with their first and second terminal into the RF path of each channel between the output of the RF amplifier and one of the channels of the multi-channel transmit/receive antenna device or RF coil arrangement, respectively;
  a number n of RF loads which are each connected with the third terminal of the circulator of each channel and which are provided for dissipating RF power which is reflected into the second terminal of the related circulator;
  a number n of first directional couplers which are each connected between the output of the RF amplifier and the first terminal of the circulator and wherein the first directional couplers provide a first forward power signal and a first reflected power signal to an internal power monitoring unit of the RF amplifier and/or to a central power monitoring unit of the circuit arrangement.

2. Circuit arrangement according to claim 1, wherein a number n of second directional couplers is provided which are each connected between the second terminal of the circulator of each channel and one of the channels of the multi-channel transmit/receive antenna device or RF coil arrangement and wherein the second directional couplers provide a second forward power signal and a second reflected power signal to the central power monitoring unit.

3. Circuit arrangement according to claim 1, wherein a number n of third directional couplers is provided which are each connected between the third terminal of the circulator and the RF load of each channel and wherein the third directional couplers provide a third forward power signal and a third reflected power signal to the central power monitoring unit.

4. Circuit arrangement according to claim 1, wherein the internal power monitoring unit is provided for monitoring the first forward power signals and the first reflected power signals for shutting down the RF amplifier if a preset maximum value of a peak RF power level generated by the RF amplifier is exceeded and if a reflected power level exceeds a level by which the RF amplifier can be damaged, respectively.

5. Circuit arrangement according to claim 1, wherein the central power monitoring unit is provided for monitoring at least one of the forward and/or reflected RF power level signals, and for blanking one or all of the RF amplifiers if preset maximum power levels supplied to the number of n coils and/or coil segments and/or sums of such power levels from different channels are exceeded.

6. Spectrometer, especially for use in a magnetic resonance imaging system, comprising a circuit arrangement according to claim 1.

7. Magnetic resonance imaging system comprising a circuit arrangement according to claim 1.

8. Method for operating a multi-channel transmit/receive antenna device or RF coil arrangement, with a number n of RF coils and/or coil segments, for use in a magnetic resonance imaging system, with a circuit arrangement according to claim 1, wherein at least one set maximum trip level is compared with at least one of the actual forward and/or reflected power level signals, and/or wherein at least one set maximum sum power level is compared with an actual forward and/or reflected sum power level signal of different channels, in order to monitor and/or to evaluate the RF power which is fed to and/or received from the multi-channel transmit/receive antenna device or RF coil arrangement, respectively.

9. Method according to claim 8, wherein at least one of the RF amplifiers is switched off by the central power monitoring unit if an actual power level exceeds a maximum trip level and/or an actual sum power level exceeds a maximum sum level.

10. Computer program comprising computer program code means adapted to perform a method according to claim 8 when said program is run on a programmable microcomputer.

11. Computer program according to claim 10 adapted to be downloaded to a magnetic resonance imaging system or one of its components when run on a computer which is connected to the internet.

12. Computer program product stored on a computer readable medium, comprising computer program code means according to claim 10.

* * * * *